US010509446B2

(12) United States Patent
Tsai et al.

(10) Patent No.: US 10,509,446 B2
(45) Date of Patent: Dec. 17, 2019

(54) COOLING APPARATUS FOR ELECTRONIC COMPONENTS

(71) Applicant: COOLER MASTER CO., LTD., New Taipei (TW)

(72) Inventors: Shui-Fa Tsai, New Taipei (TW); Fu-Lung Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 352 days.

(21) Appl. No.: 15/395,954

(22) Filed: Dec. 30, 2016

(65) Prior Publication Data
US 2017/0192471 A1 Jul. 6, 2017

(30) Foreign Application Priority Data

Dec. 30, 2015 (CN) .......................... 2015 1 1023351
Dec. 9, 2016 (CN) .......................... 2016 1 1132425

(51) Int. Cl.
*G06F 1/20* (2006.01)

(52) U.S. Cl.
CPC .......... *G06F 1/20* (2013.01); *G06F 2200/201* (2013.01)

(58) Field of Classification Search
CPC ... G06F 1/20; G06F 2200/201; H01L 23/473; H01L 23/4006; H01L 23/373; H01L 23/3736; H05K 7/20254
USPC .......................... 165/80.4; 361/699; 415/176
See application file for complete search history.

(56) References Cited

U.S. PATENT DOCUMENTS

| 5,052,472 | A | 10/1991 | Takahashi et al. |
| 6,054,676 | A * | 4/2000 | Wall .................. H01L 23/345 165/104.33 |
| 6,167,952 | B1 | 1/2001 | Downing |
| 6,966,359 | B1 | 11/2005 | Liu |
| 7,007,506 | B2 * | 3/2006 | Kubo ............... F28D 15/0266 165/170 |
| 7,055,581 | B1 | 6/2006 | Roy |
| 7,240,722 | B2 * | 7/2007 | Lai ........................ F28F 3/12 165/104.21 |

(Continued)

FOREIGN PATENT DOCUMENTS

| DE | 102011121064 A1 | 6/2013 |
| JP | S61-018159 A | 1/1986 |

(Continued)

OTHER PUBLICATIONS

Non-Final Office Action issued in U.S. Appl. No. 15/433,073, dated Jun. 22, 2018.

(Continued)

*Primary Examiner* — J. Todd Newton
(74) *Attorney, Agent, or Firm* — McDermott Will & Emery LLP

(57) ABSTRACT

A cooling apparatus that includes a base plate configured to dissipate heat and including a heat exchange unit, and a cover member coupled to the base plate and at least partially enclosing the heat exchange unit. The cover member and the base plate define a heat exchange chamber that includes the heat exchange unit. The cover member defines a first opening and a second opening, and at least one of the first and second openings are above the heat exchange unit. The cooling apparatus further includes a flow guidance plate disposed on the cover member and a housing disposed on the flow guidance plate.

20 Claims, 20 Drawing Sheets

(56) References Cited

U.S. PATENT DOCUMENTS

| | | | |
|---|---|---|---|
| 7,249,625 B2 | 7/2007 | Duan | |
| 7,325,591 B2 | 2/2008 | Duan et al. | |
| 8,051,898 B2 | 11/2011 | Chiang | |
| 8,240,362 B2 | 8/2012 | Eriksen | |
| 8,245,764 B2 | 8/2012 | Eriksen | |
| 8,261,813 B2 * | 9/2012 | Oikawa | H05K 7/20272 165/104.28 |
| 8,746,330 B2 * | 6/2014 | Lyon | F28D 15/00 165/170 |
| 9,345,169 B1 * | 5/2016 | Campbell | H05K 7/20254 |
| 9,441,640 B2 | 9/2016 | Park et al. | |
| 9,795,058 B2 | 10/2017 | Tsai | |
| 2004/0130874 A1 | 7/2004 | Maveety et al. | |
| 2005/0241806 A1 | 11/2005 | Liu | |
| 2006/0185378 A1 | 8/2006 | Duan et al. | |
| 2006/0225867 A1 * | 10/2006 | Park | H05K 7/20254 165/80.4 |
| 2008/0029260 A1 | 2/2008 | Hu et al. | |
| 2009/0101316 A1 * | 4/2009 | Han | F28D 15/00 165/104.33 |
| 2009/0159244 A1 * | 6/2009 | Mouniloux | F04D 29/586 165/104.33 |
| 2009/0284921 A1 | 11/2009 | Colgan et al. | |
| 2012/0152498 A1 * | 6/2012 | Lyon | F28D 15/00 165/104.31 |
| 2012/0175094 A1 * | 7/2012 | Rice | F28D 1/03 165/170 |
| 2013/0008628 A1 | 1/2013 | Tiengtum et al. | |
| 2013/0051108 A1 | 2/2013 | Nagao et al. | |
| 2015/0021756 A1 | 1/2015 | Adachi | |
| 2016/0309618 A1 * | 10/2016 | Tsai | B23P 15/26 |
| 2016/0338223 A1 * | 11/2016 | Tsai | F28F 1/00 |
| 2016/0363967 A1 * | 12/2016 | Tsai | G06F 1/20 |
| 2017/0045300 A1 * | 2/2017 | Boday | B23P 15/26 |
| 2017/0045306 A1 * | 2/2017 | Tsai | H05K 7/20254 |
| 2017/0045307 A1 * | 2/2017 | Tsai | F28F 3/02 |
| 2017/0118870 A1 * | 4/2017 | Yin | F04D 29/5806 |
| 2017/0192471 A1 * | 7/2017 | Tsai | G06F 1/20 |
| 2017/0235350 A1 * | 8/2017 | Tsai | H01L 23/473 165/80.4 |
| 2018/0139865 A1 * | 5/2018 | Draht | H05K 7/20254 |
| 2018/0213677 A1 * | 7/2018 | Wu | H05K 7/20254 |
| 2018/0259267 A1 * | 9/2018 | Tsai | F28D 9/0062 |
| 2018/0332734 A1 * | 11/2018 | Bandorawalla | G06F 1/20 |
| 2018/0340744 A1 * | 11/2018 | Tsai | F28F 3/02 |

FOREIGN PATENT DOCUMENTS

| | | |
|---|---|---|
| KR | 10-0529825 B1 | 11/2005 |
| TW | M278938 U | 10/2005 |
| TW | M311234 U | 5/2007 |

OTHER PUBLICATIONS

Chinese Patent Application No. 201611132425.3 filed Dec. 9, 2016 with English translation.
Chinese Patent Application CN 201511023351.5 filed Dec. 30, 2015 with English translation.
Final Office Action issued in U.S. Appl. No. 14/988,753, dated Jan. 11, 2019.
Non-Final Office Action issued in U.S. Appl. No. 14/988,753, dated Aug. 8, 2018.
Final Office Action issued in U.S. Appl. No. 14/988,753, dated Jan. 16, 2018.
Non-Final Office Action issued in U.S. Appl. No. 14/988,753, dated Jul. 31, 2017.
Non-Final Office Action issued in U.S. Appl. No. 15/395,954, dated Feb. 15, 2019.
Final Office Action issued in U.S. Appl. No. 15/433,073, dated Nov. 13, 2018.

* cited by examiner

COOLING APPARATUS FOR ELECTRONIC COMPONENTS

CROSS-REFERENCE TO RELATED APPLICATIONS

This non-provisional application claims priority under 35 U.S.C. § 119 to Chinese patent applications nos. 201511023351.5 filed Dec. 30, 2015, and 201611132425.3 filed Dec. 9, 2016, in the State Intellectual Property Office (SIPO) of the People's Republic of China (PRC), the entire contents of both these applications are incorporated herein by reference in their entirety.

BACKGROUND

Field

Embodiments disclosed are related to heat dissipation using fluid, and more particularly, to a cooling apparatus that dissipates heat generated by a computing device using a circulating cooling fluid.

Description of Related Art

With the increase of the processing speed and performance of electronic components, such as central processing units (CPU), the amount of heat generated during operation of the electronic component increases. The heat generation increases the temperature of the electronic component and, if the heat cannot be dissipated effectively, the reliability and performance of the electronic component is reduced. To prevent overheating of an electronic component, typically, a water cooling apparatus is used for cooling the electronic component and, thereby maintain normal operation of the electronic component.

Existing fluid cooling apparatuses typically include a base plate of a heat exchange chamber attached to a CPU, and the heat exchange chamber is fluidly connected to a fluid circulating pump. The pump circulates the fluid inside the heat exchange chamber in order to deliver the fluid at lower temperature to the heat exchange chamber. As the fluid circulates in the heat exchange chamber, thermal energy is exchanged between the base plate and the fluid and, as a result, the temperature of the base plate is reduced and the temperature of the fluid increases. However, the existing heat exchange chambers are often of complicated structures and this causes a reduction in the heat transfer efficiency.

SUMMARY

Various aspects of the present disclosure provide a cooling apparatus for dissipating heat generated by electronic components.

According to one aspect of the present disclosure, the cooling apparatus includes a base plate configured to dissipate heat and a heat exchange unit forming an array on the base plate, and a cover member coupled to the base plate and at least partially enclosing the heat exchange unit. The cover member and the base plate define a heat exchange chamber that includes the heat exchange unit. The cover member defines a first opening and a second opening, and wherein at least one of first and second openings is above the heat exchange unit. The cooling apparatus further includes a flow guidance plate disposed on the cover member and a housing disposed on the flow guidance plate.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Embodiments described herein are directed to a cooling apparatus that increases heat transfer efficiency. The disclosed cooling apparatus has a relatively simpler design of the heat exchange chamber compared to prior art cooling apparatuses.

The embodiments illustrated in FIGS. 1-21 described in detail the different individual component parts of the disclosed cooling apparatus 150.

Figure 1:
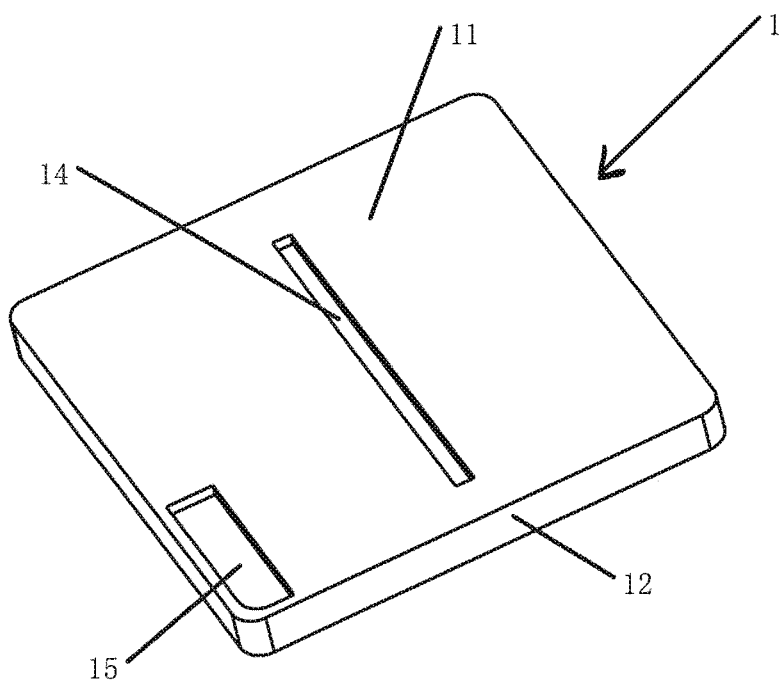
FIG. 1 illustrates a top perspective view of a cover member of a cooling apparatus, according to embodiments disclosed.
Figure 2:
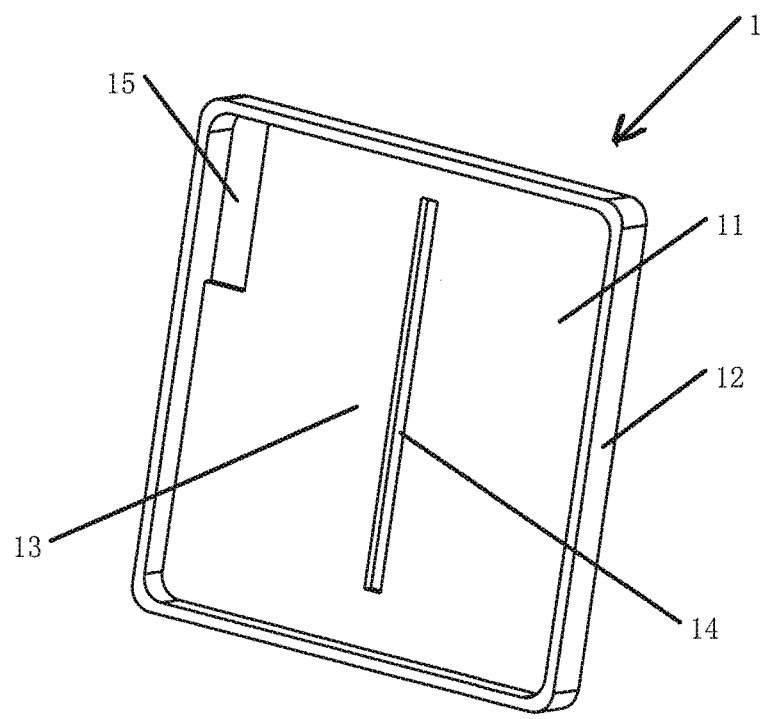
FIG. 2 illustrates a bottom perspective view of the cover member of FIG. 1, according to embodiments disclosed.

FIG. 1 illustrates a top perspective view of a cover member 1, according to embodiments disclosed. FIG. 2 illustrates a bottom perspective view of the cover member 1, according to embodiments disclosed. As illustrated in FIGS. 1 and 2, the cover member 1 includes a top plate 11 having a peripheral sidewall 12 disposed at an edge of the top plate 11. The top plate 11 may be a generally rectangular or square in shape and the sidewall 12 may be disposed along the entire perimeter of the top plate 11. The top plate 11 and the sidewall 12 together define or otherwise enclose a space 13. The top plate 11 defines a first opening 14 and a second opening 15. The first and second openings 14 and 15 may be shaped as elongated slots extending parallel to each other in the top plate 11. As illustrated, the first opening 14 may be longer than the second opening 15. However, the first and second openings 14 and 15 are not limited to elongated slots, and the first and second openings 14 and 15 may be square, circular, polygonal, or of any desired shape, and may have any desired size, without departing from the scope of the disclosure. The cover member 1 (or at least a portion thereof) may include a non-metal material such as plastic.

Figure 3:
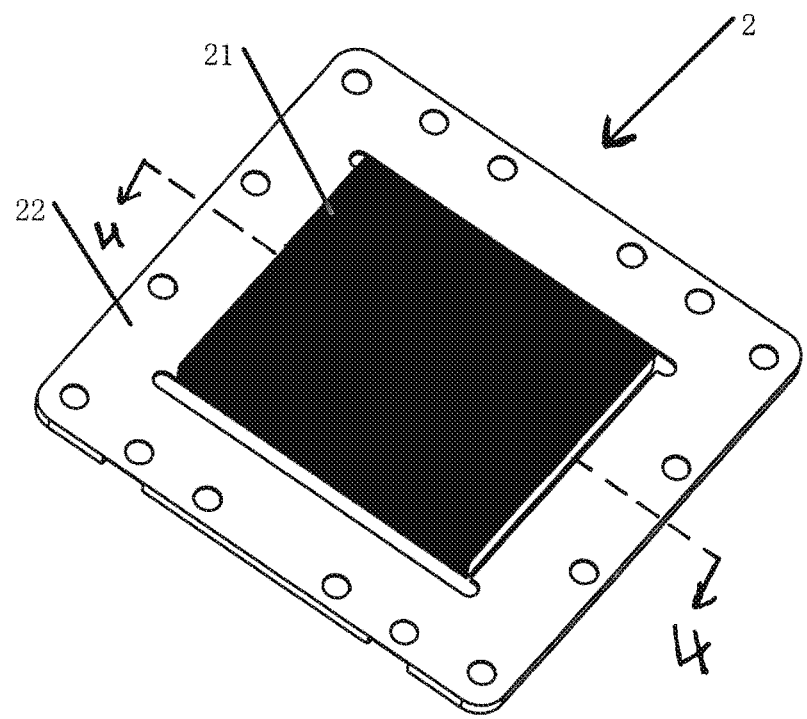
FIG. 3 illustrates a top perspective view of a base plate of the cooling apparatus, according to embodiments disclosed.
Figure 4:
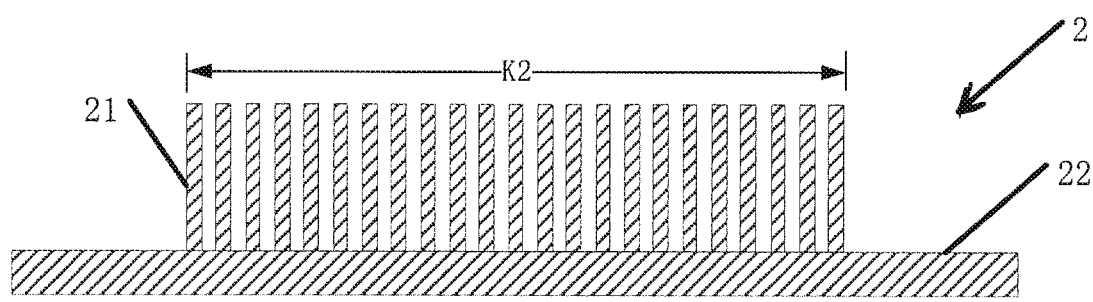
FIG. 4 illustrates a cross-sectional view of the base plate of FIG. 3 taken along the line 4-4, according to embodiments disclosed.

FIG. 3 illustrates a top perspective view of a base plate 2, according to embodiments disclosed. FIG. 4 illustrates a cross-sectional view of the base plate 2 taken along the line 4-4, according to embodiments disclosed. As shown in FIGS. 3 and 4, a heat exchange unit may be disposed on a side of the base plate 2. In an embodiment and as illustrated, the heat exchange unit may be or include an array of a plurality of fins 21. However, in other embodiments, the heat exchange unit may be or include pins, columns, or any other structure of a desired shape and size for dissipating heat, without departing from the scope of the disclosure. Although not illustrated, an electronic component from which heat is to be dissipated is coupled to a side of the base plate 2 opposite the side including the heat exchange unit.

As illustrated, the fins 21 extend transversely on the base plate 2 along the length (or width) thereof, and are arranged parallel to each other and perpendicular to the base plate 2. However, in other embodiments, some or all of the plurality of fins 21 may be non-parallel to each other and may be arranged on the base plate 2 at an angle less than 90°. The array of fins 21 may occupy a generally central portion of the base plate 2 and extend a distance K2. The base plate 2 may define a peripheral surface 22 surrounding the fins 21. The base plate 2 (or at least a portion thereof) includes a thermally conductive material, such as a metal including copper, aluminum etc., or non-metal thermally conductive material, such as graphite etc. The fins 21 (or at least a portion thereof) may also include a thermal conductive material. In an embodiment, the fins 21 and the base plate 2 may be integrally formed as a single piece. In another embodiment, the fins 21 may be coupled to the base plate 2 using known techniques.

Figure 5:
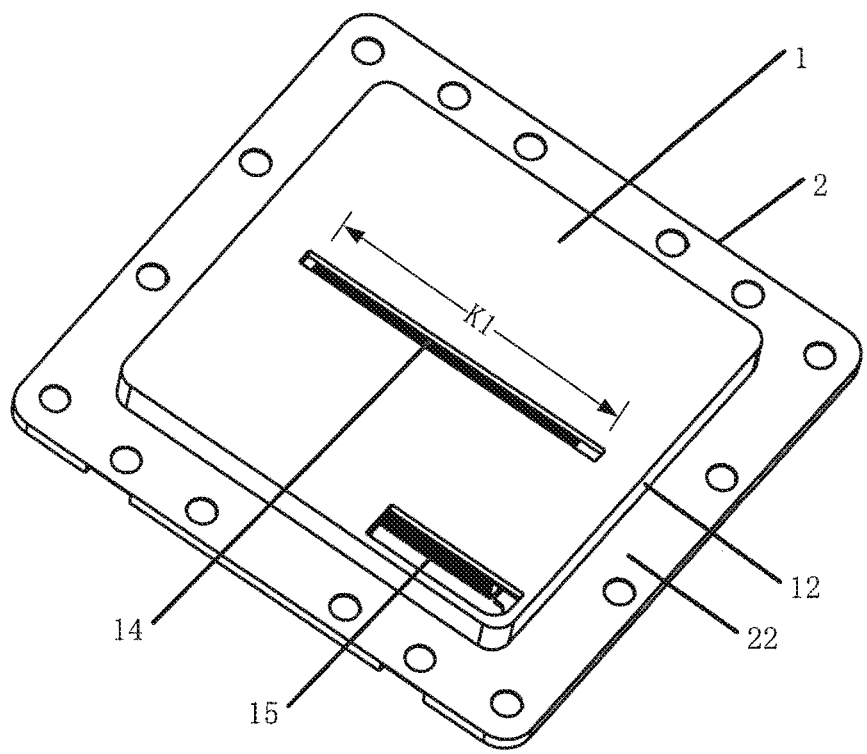
FIG. 5 illustrates a top perspective view of the base plate of FIG. 3 having the cover member of FIG. 1 positioned on the base plate, according to embodiments disclosed.

FIG. 5 illustrates a top perspective view of the base plate 2 having the cover member 1 positioned on the base plate 2, according to embodiments disclosed. As shown in FIG. 5, cover member 1 is disposed on the base plate 2 such that all the fins 21 are received in the space 13. When disposed on the base plate 2, the top plate 11, the sidewalls 12, and the base plate 2 cooperatively define a heat exchange chamber. The cover member 1 may be welded to the base plate 2 to secure the cover member 1 to the base plate 2. The welding is not limited to any specific type of welding and the cover member 1 may be welded to the base plate 2 using any suitable type of welding, without departing from the scope of the disclosure. Other fastening techniques, such as riveting, screwing, press-fitting, and the like, fasteners, such as rivets, screws, nuts, bolts, etc., may be used to secure the cover member 1 to the base plate 2. However, the fasteners occupy a substantial amount of space in an already space-constrained environment. Also, to provide an air-tight seal, fastening techniques requiring sealing elements, such as gaskets, O-rings, washers, and the like, would further occupy space.

The base plate 2 may be positioned on the cover member 1 such that at least one of the first and second openings 14 and 15 is positioned over the fins 21 (or any other heat exchange unit used). Referring to FIG. 5, the base plate 2 may be positioned such that the fins 21 extend in a direction perpendicular to the direction in which the first opening 14 and the second opening 15 extend. Stated otherwise, the fins 21 extend in a direction from the first opening 14 to the second opening 15. The base plate 2 is attached to an electronic component (e.g., a central processing unit (CPU)) from which heat is to be dissipated. Specifically, and as mentioned above, the electronic component from which heat is to be dissipated is attached to the bottom surface (e.g., the surface of the base plate 2 opposite to the surface having the fin 21) using a thermally conductive material (e.g., thermal grease) in order to transfer the heat generated from the electronic component to the base plate 2.

During operation, a fluid having a relatively lower temperature may be circulated into the heat exchange chamber. The fluid may enter the heat exchange chamber via the first opening 14 and flow along the fins 21. While flowing, the heat generated by the electronic component may be transferred to the fluid via the base plate 2 and the fins 21, and the temperature of the fluid may increase. The fluid having the increased temperature exits the heat exchange chamber via the second opening 15.

The vertical extent of the fins 21 from base plate 2 is such that the top edge of the fins 21 may contact (or be in close proximity) the cover member 1. Thus, the fluid (or at least a major portion thereof) entering the heat exchange chamber flows along the fins 21 and, as a result, the heat exchange efficiency between the fins 21 and the base plate 2 is increased. Furthermore, as shown in FIGS. 4 and 5, the width K1 of the first opening 14 is substantially equal to the distance K2 occupied by the fins 21, and this causes the low-temperature fluid to flow along each fin and, thereby increase the heat exchange efficiency. In addition, the difference in the lengths of the first and second openings 14, 15 causes the fluid to remain in the heat exchange chamber for relatively longer time duration, and, further increase the heat exchange efficiency. Still further, the elongated shape of the first opening 14 reduces the passage area for the fluid entering the heat exchange chamber and thus the flow velocity of the fluid is increased. The increased flow velocity further increases the heat exchange efficiency.

Figure 6:
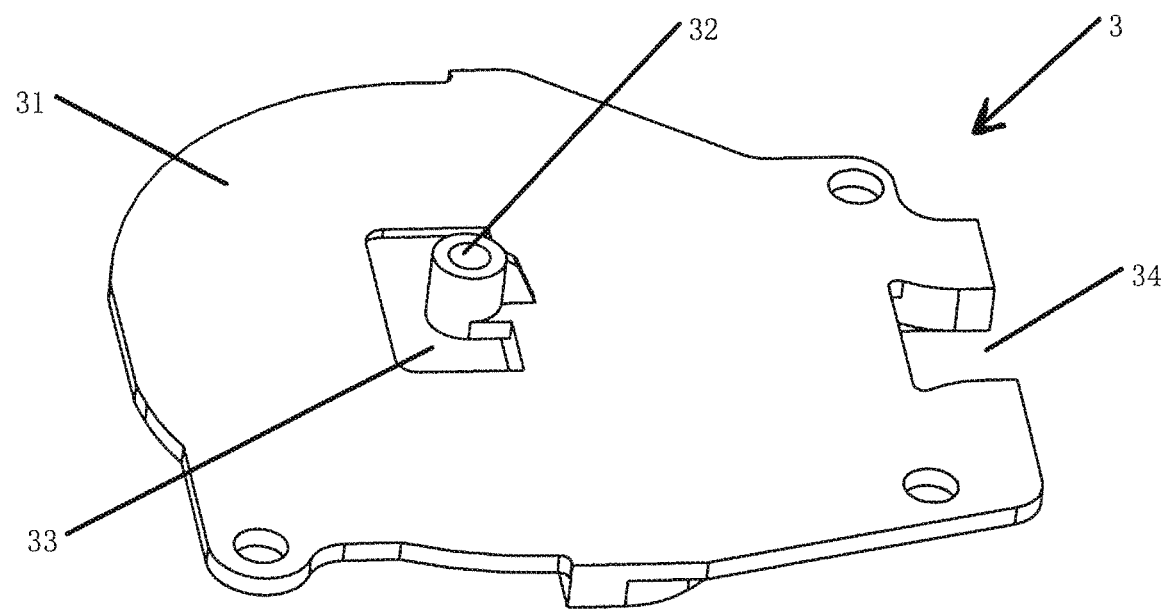
FIG. 6 illustrates a top perspective view of a flow guidance plate of the cooling apparatus, according to embodiments disclosed.

FIG. 6 illustrates a top perspective view of a flow guidance plate 3, according to embodiments disclosed. As shown in FIG. 6, the flow guidance plate 3 includes a body 31 defining a first plate opening 33 and a second plate opening 34. A first guide sleeve 32 is disposed in the first plate opening 33.

Figure 7:
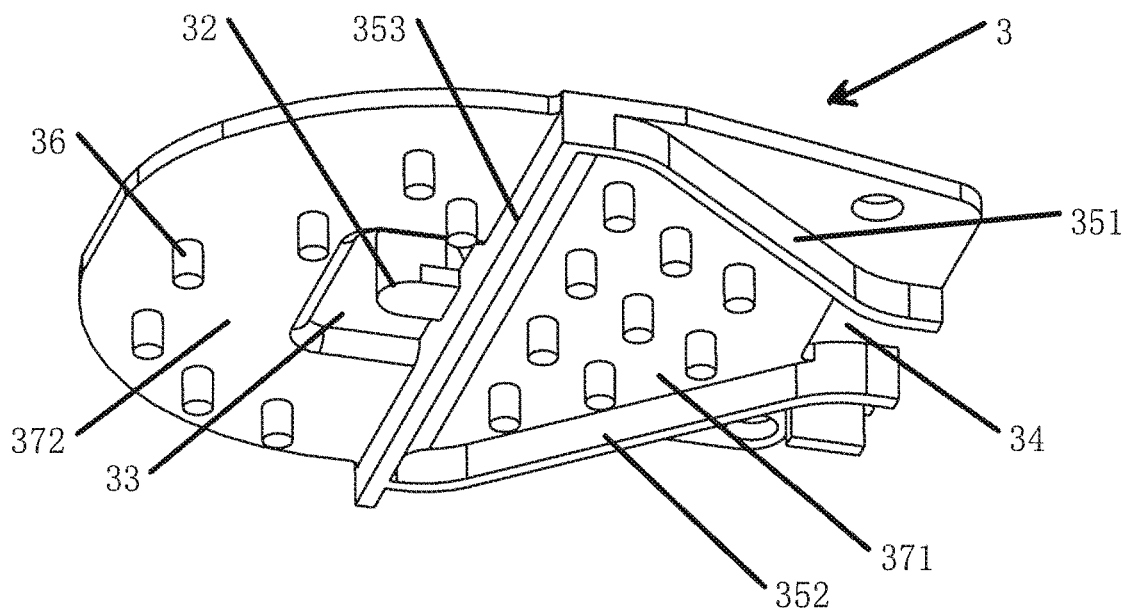
FIG. 7 illustrates a bottom perspective view of the flow guidance plate of FIG. 6, according to embodiments disclosed.
Figure 8:
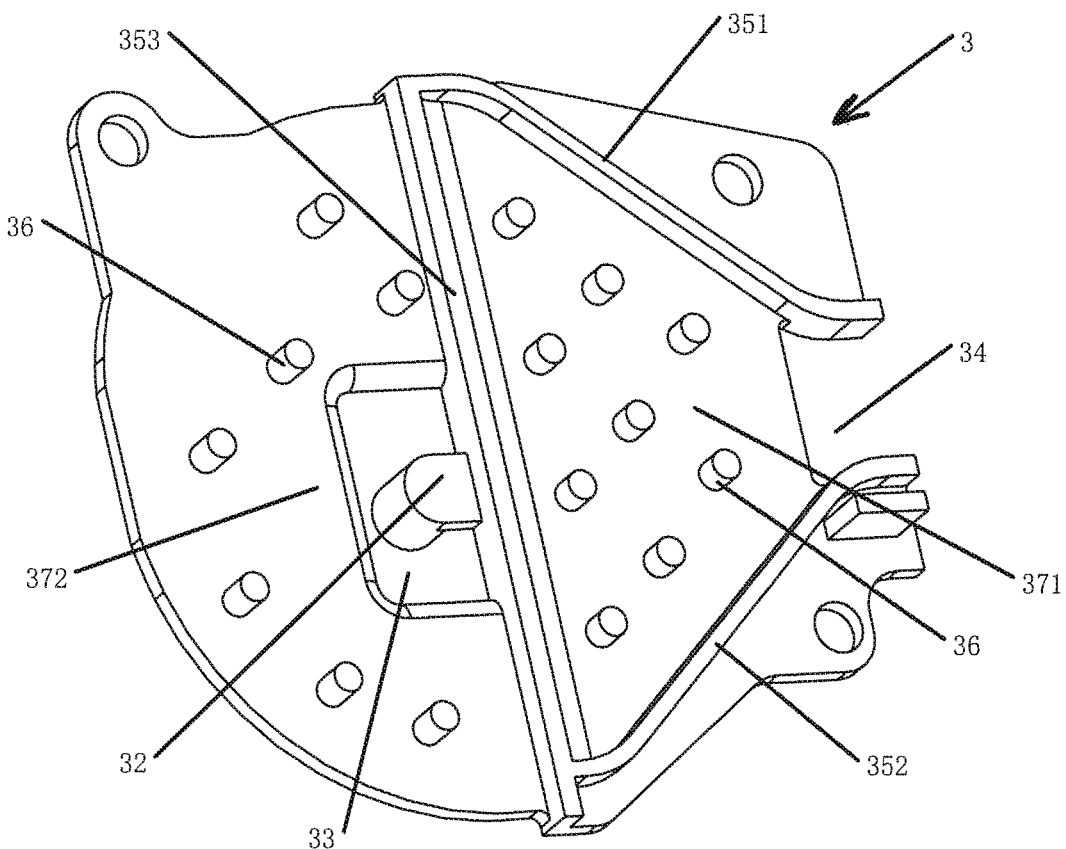
FIG. 8 illustrates another bottom perspective view of the flow guidance plate of FIG. 6, according to embodiments disclosed.

FIGS. 7 and 8 illustrate bottom perspective views of the flow guidance plate 3, according to embodiments disclosed. As shown in FIGS. 7 and 8, the bottom surface of the body 31 of the flow guidance plate 3 includes two sidewalls 351, 352, and an end of each sidewall 351, 352 extending generally longitudinally from the second plate opening 34 to an end wall 353 that extends transversely across the flow guidance plate 3. The end wall 353 and the sidewalls 351, 352 together form a first cavity 371. The first cavity 371 is in fluid communication with the second plate opening 34.

The end wall 353 defines the first cavity 371 on one side thereof and a second cavity 372 on an opposite side thereof. The end wall 353 is disposed adjacent the first plate opening 33.

In existing designs, the fluid first enters a heat exchange chamber, causing a pumping chamber (detailed below) to receive fluid having a higher temperature (around 60-80° C.). This results in premature damage and deterioration of the stator and/or rotor units. As explained below, by defining the first cavity 371 and the second cavity 372, the overall volume of the cooling apparatus 150 (FIGS. 15A-15D) may be reduced, and damage to the stator and/or rotor units minimized.

The bottom surface of the flow guidance plate 3 further includes a plurality of columns 36 formed thereon and disposed uniformly in the first cavity 371 and the second cavity 372. The columns 36 contact the top plate 11 and provide support to the flow guidance plate 3.

Figure 9:
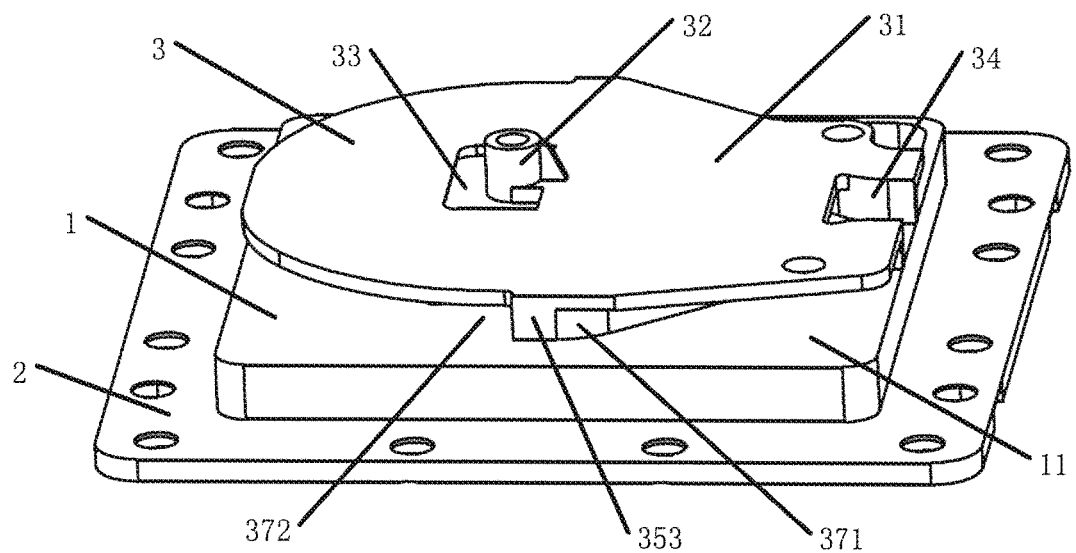
FIG. 9 illustrates a top perspective view of a structure formed by assembling the cover member, base plate, and the flow guidance plate, according to embodiments disclosed.

FIG. 9 illustrates a top perspective view of a structure formed by assembling the cover member 1, base plate 2, and the flow guidance plate 3, according to embodiments disclosed. As shown in FIG. 9, when assembled, the cover member 1 is between the base plate 2 and the flow guidance plate 3.

The flow guidance plate 3 is positioned on the cover member 1 such that the first opening 14 of the cover member 1 is located on a side of the end wall 353 including the first cavity 371. The first opening 14 and the first cavity 371 are in fluid communication with each other. The first cavity 371 is defined by the top plate 11 of the cover member 1, the flow guidance plate 3, the end wall 353, and the sidewalls 351, 352. The only two openings in fluid communication with the first cavity 371 are the first opening 14 of the cover member 1 and the second plate opening 34 of the flow guidance plate 3.

When assembled, the second cavity 372 is defined by the body 31 of the flow guidance plate 3 on the top and the top plate 11 of the cover member 1 on the bottom. The end wall 353 bounds one side of the second cavity 372 and the remaining three sides of the second cavity 372 are unbounded. The first plate opening 33 of the flow guidance plate 3 is located on a side of the end wall 353 opposite the first cavity 371 and is in fluid communication with the second cavity 372.

Figure 10:
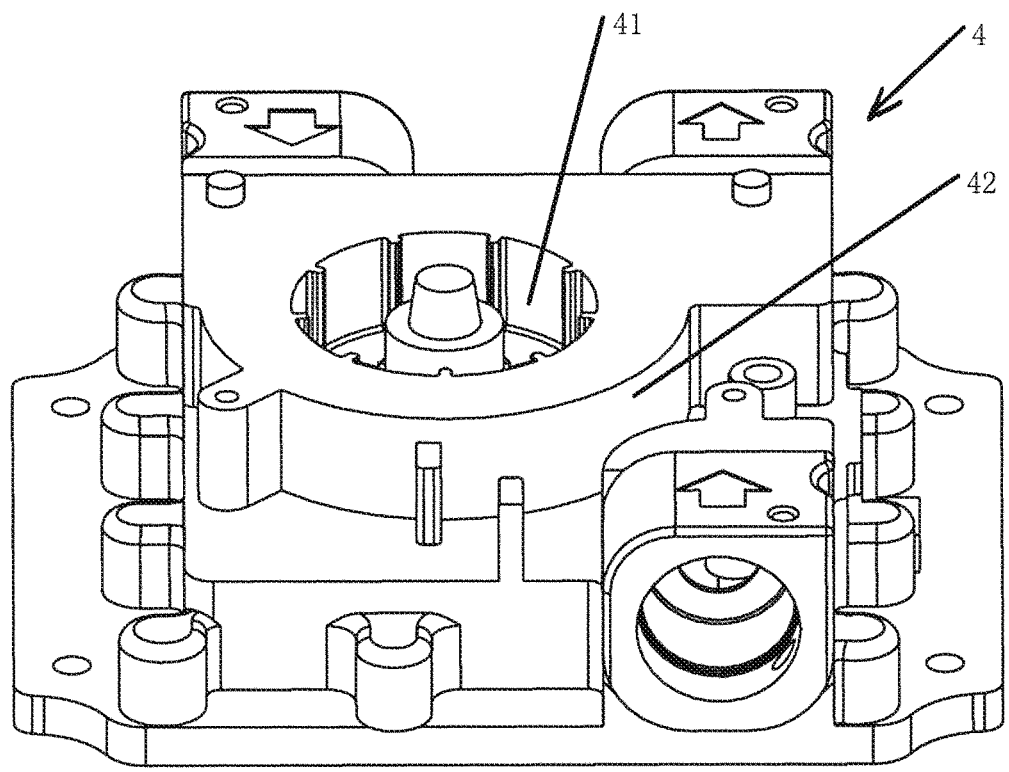
FIG. 10 illustrates a top perspective view of a housing of the cooling apparatus, according to embodiments disclosed.

FIG. 10 illustrates a top perspective view of a housing 4, according to embodiments disclosed. As shown in FIG. 10, the housing 4 defines a first cavity 41 that is sized or otherwise configured to receive a stator unit therein.

Figure 11:
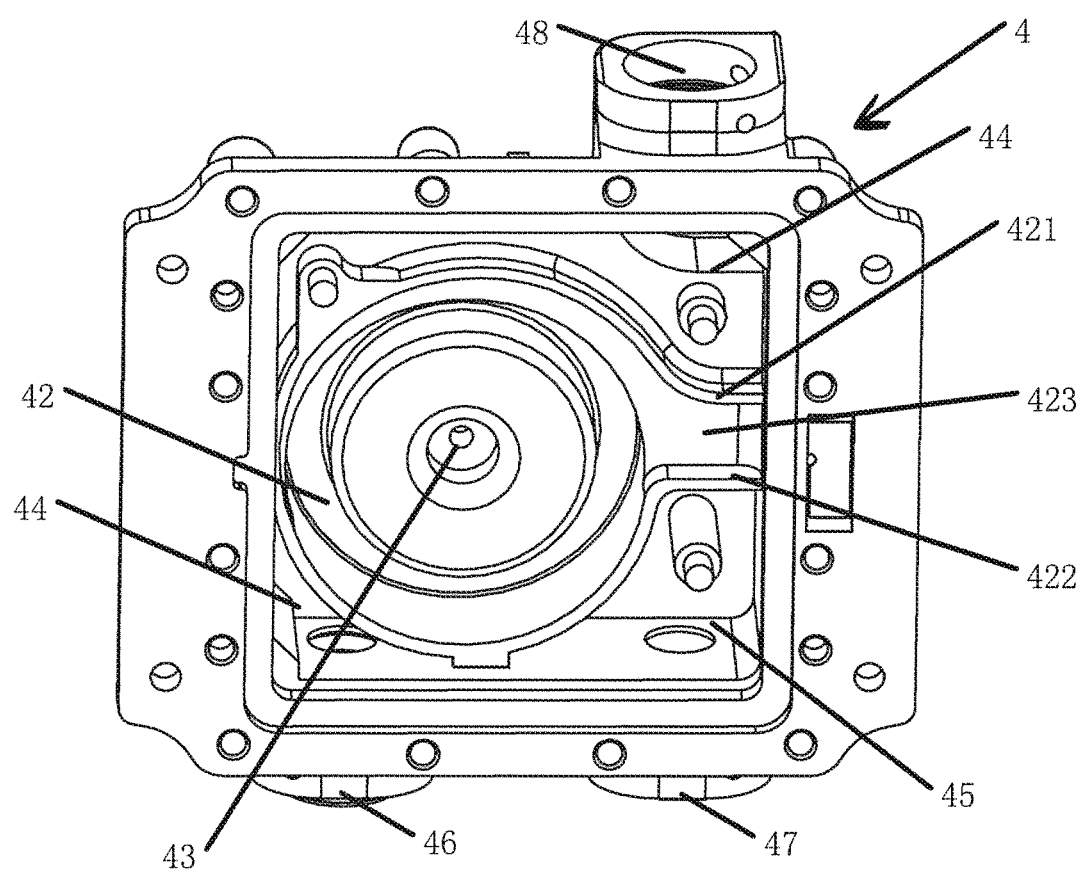
FIG. 11 illustrates a bottom perspective view of the housing of FIG. 10, according to embodiments disclosed
Figure 13:
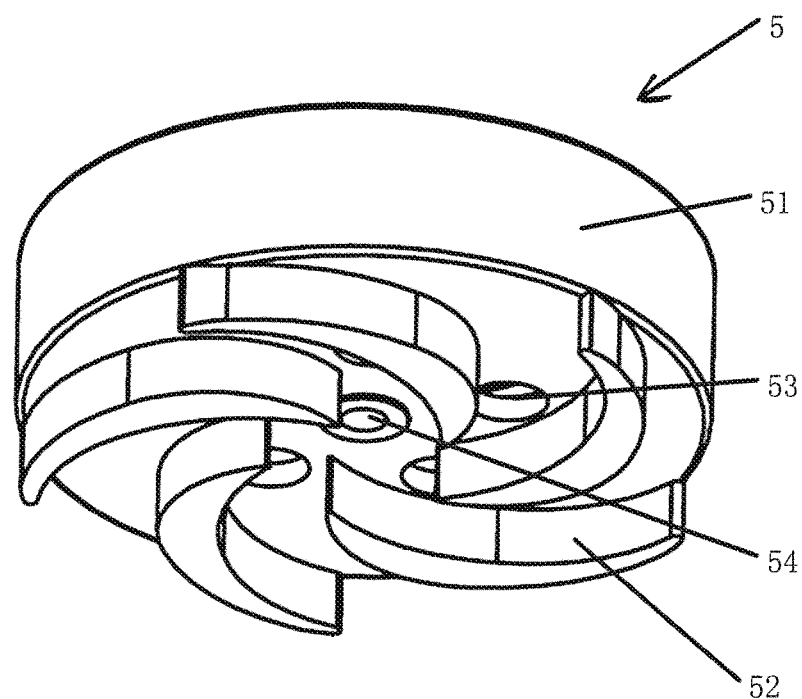
FIG. 13 illustrates a bottom perspective view of a rotor unit of the cooling apparatus, according to embodiments disclosed.

FIG. 11 illustrates a bottom perspective view of the housing 4, according to embodiments disclosed. As shown in FIG. 11, the bottom of the housing 4 defines a second cavity 42 that is sized or otherwise configured to receive a rotor unit 5 (FIG. 13). The second cavity 42 at least partially defines the pumping chamber of the cooling apparatus 150. The first cavity 41 and the second cavity 42 are fluidly isolated from each other in order to prevent the fluid from entering the first cavity 41, and reaching the stator unit and any circuitry associated with the stator unit.

Figure 12:
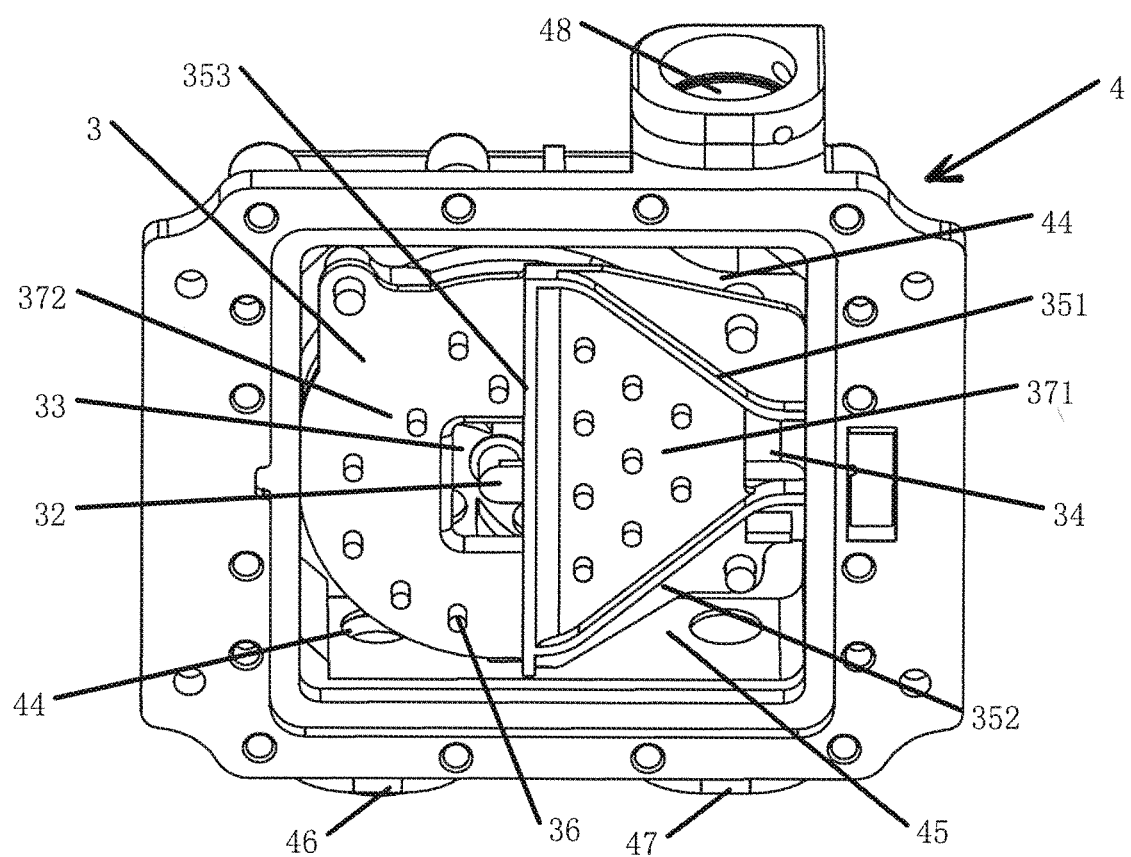
FIG. 12 illustrates a bottom perspective view of the housing of FIG. 10 with the flow guidance plate of FIG. 6 coupled thereto, according to embodiments disclosed.

FIG. 12 illustrates a bottom perspective view of the housing 4 with the flow guidance plate 3 coupled thereto, according to embodiments disclosed. As shown in FIG. 12, the flow guidance plate 3 is positioned underneath the second cavity 42, and seals the second cavity 42. The first cavity 371 is in fluid communication with the channel 423 via the second plate opening 34, and the second cavity 372 is in fluid communication with the second cavity 42 of the housing 4 via the first plate opening 33.

Referring to FIGS. 11 and 12, with the flow guidance plate 3 coupled to the housing 4, the pumping chamber is defined by the main body 31 of the flow guidance plate 3.

As illustrated, the second cavity 42 is further defined by the extension portions 421, 422. The extension portions 421, 422 also define a channel 423 that is in fluid communication with the second plate opening 34 of the first cavity 371 when the housing 4 is positioned on the flow guidance plate 3. The center of the second cavity 42 includes a second guide sleeve 43 that may align with the first guide sleeve 32 of the flow guidance plate 3 when the flow guidance plate 3 is positioned in the housing 4. The second guide sleeve 43 is sized or otherwise configured to receive the rotating axle of the rotor unit 5.

The extension portions 421, 422 and the housing 4 at least partially define a third cavity 44 and a fourth cavity 45 therebetween. The third cavity 44 and the fourth cavity 45 are separated from each other. With reference to FIG. 11, when the housing 4 is positioned on the flow guidance plate 3, the fourth cavity 45 is located on a lower right corner on the bottom of the housing 4. The third cavity 44 is divided into two parts that are arranged diagonally from each other. Specifically, with reference to FIG. 11, one portion of the third cavity 44 is arranged on a top right corner and opposite the fourth cavity 45 on the bottom of the housing 4, and a second portion of the third cavity 44 is arranged at a lower left corner of the housing 4. The two portions of the third cavity 44 are in fluid communication with each other via the unbounded portion of the second cavity 372. When the flow guidance plate 3 is positioned in the housing 4, the fourth cavity 45 is in fluid communication with the second opening 15 of the cover member 1.

The housing 4 includes inlets 46, 48 in fluid communication with the third cavity 44, and an outlet 47 in fluid communication with the fourth cavity 45. In an embodiment, the cooling apparatus 150 is connected to an external heat dissipating device (e.g., a radiator or similar device) and a fluid is circulated between the cooling apparatus 150 and the external heat dissipating device. Specifically, the inlets 46, 48 of the housing 4 are connected to an outlet of the external heat dissipating device, and the outlet 47 is connected to an inlet of the external heat dissipating device.

Because the second cavity 42 is sealed by the flow guidance plate 3, fluid volume loss may be minimized and delivery efficiency can be increased during the operation of the rotor unit 5 positioned in the second cavity 42.

During operation of the cooling apparatus 150, according to embodiments disclosed, the operation of the rotor unit 5 causes the relatively cooler fluid from the external heat dissipating device to enter into the third cavity 44 via the inlet 46 and/or the inlet 48. As mentioned above, the outer perimeter of the second cavity 372 is unbounded, and the cooler fluid inside the third cavity 44 flows through the unbounded space into the second cavity 372.

The second cavity 372 is in fluid communication with the second cavity 42 via the first plate opening 33 and the cooler fluid flows into the second cavity 42. The rotor unit 5 inside the second cavity 42 drives or otherwise imparts motion to the cooler fluid entering the second cavity 42. The cooler fluid then flows into the first cavity 371 via the channel 423 and the second plate opening 34. The cooler fluid then flows into the heat exchange chamber from the first cavity 371 via the first opening 14.

Inside the heat exchange chamber, the heat from the base plate 2 and the fins 21 is transferred to the cooler fluid and the temperature of the cooler fluid increases. The heated fluid flows from the heat exchange chamber into the fourth cavity 45 via the second opening 15 in the cover member 1. The heated fluid is then output from the outlet 47 of the housing 4 and flows to the external heat dissipating device. The external heat dissipating device uses a cooling device, such as a fan, to cool the heated fluid, and the cooler fluid is then recirculated to the inlet 46 and/or inlet 48 of the housing 4. In an embodiment, the inlets 46, 48 can be used selectively, and the unused inlet may be plugged.

FIG. 13 illustrates a bottom perspective view of the rotor unit 5, according to embodiments disclosed. As shown in FIG. 13, the rotor unit 5 comprises a rotating portion 51 and curved blades 52 arranged underneath the rotating portion 51.

Figure 14:
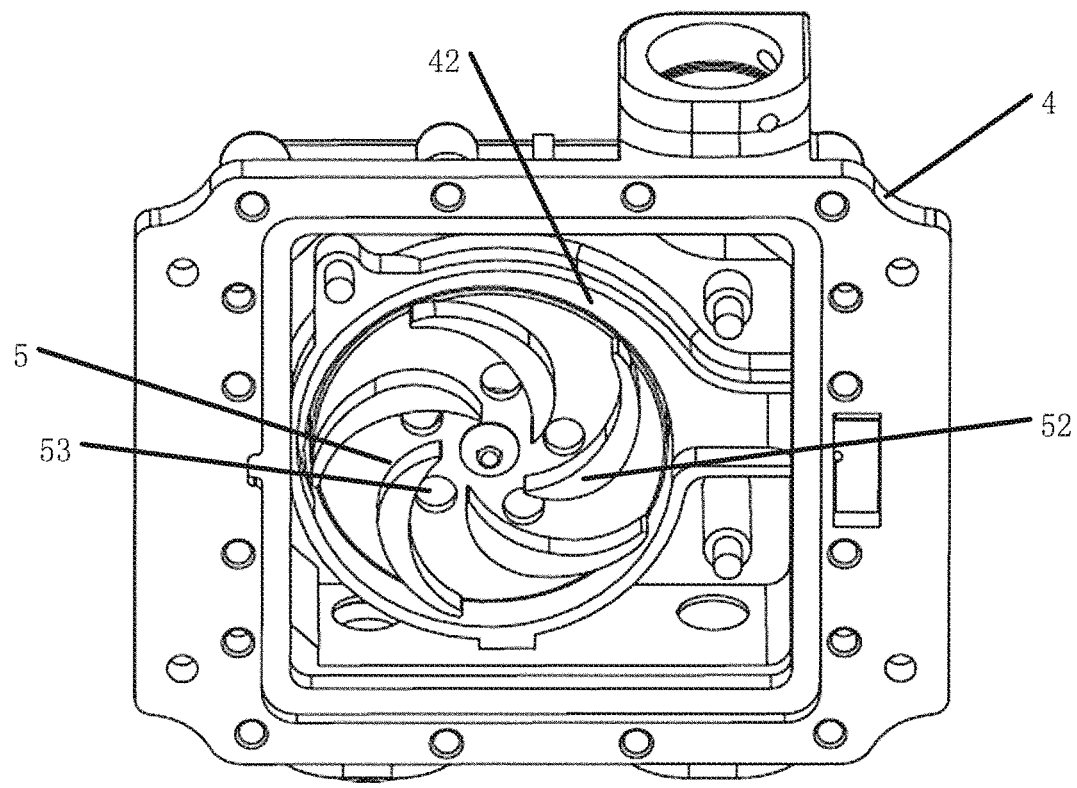
FIG. 14 illustrates a bottom perspective view of the housing of FIG. 10 including the rotor unit of FIG. 13 installed therein, according to embodiments disclosed.

FIG. 14 illustrates a bottom perspective view of the housing 4 including the rotor unit 5 installed therein, according to embodiments disclosed. Referring to FIGS. 13 and 14, the rotor unit 5 is positioned or otherwise installed in the second cavity 42 of the housing 4. The center of the rotating portion 51 includes an axle hole 54 and the axle of the rotor unit 5 passes through the axle hole 54. The axle is received in the first guide sleeve 32 of the flow guidance plate 3 and the second guide sleeve 43 of the second cavity 42. The first guide sleeve 32 and the second guide sleeve 43 provide lateral and axial support to the axle and minimize the deviation (or eccentricity) of the axle. Thus, improper operation of the rotor unit 5 due to an eccentric axle is minimized. Moreover, positioning the axle in the second guide sleeve 43 and the first guide sleeve 32 maintains the flow guidance plate 3 secured to the housing 4. If the flow guidance plate 3 is not secured, gaps may occur at the periphery of the second cavity 42 and these may cause the fluid to leak into other cavities and reduce the working efficiency of the pump. In an embodiment and as illustrated, the rotating portion 51 includes a plurality of through holes 53 disposed uniformly therein. The through holes 53 extend vertically through the rotating portion 51 and minimize the fluid pressure differential across the rotating portion 51 and thereby across the rotor unit 5.

Figure 15A:
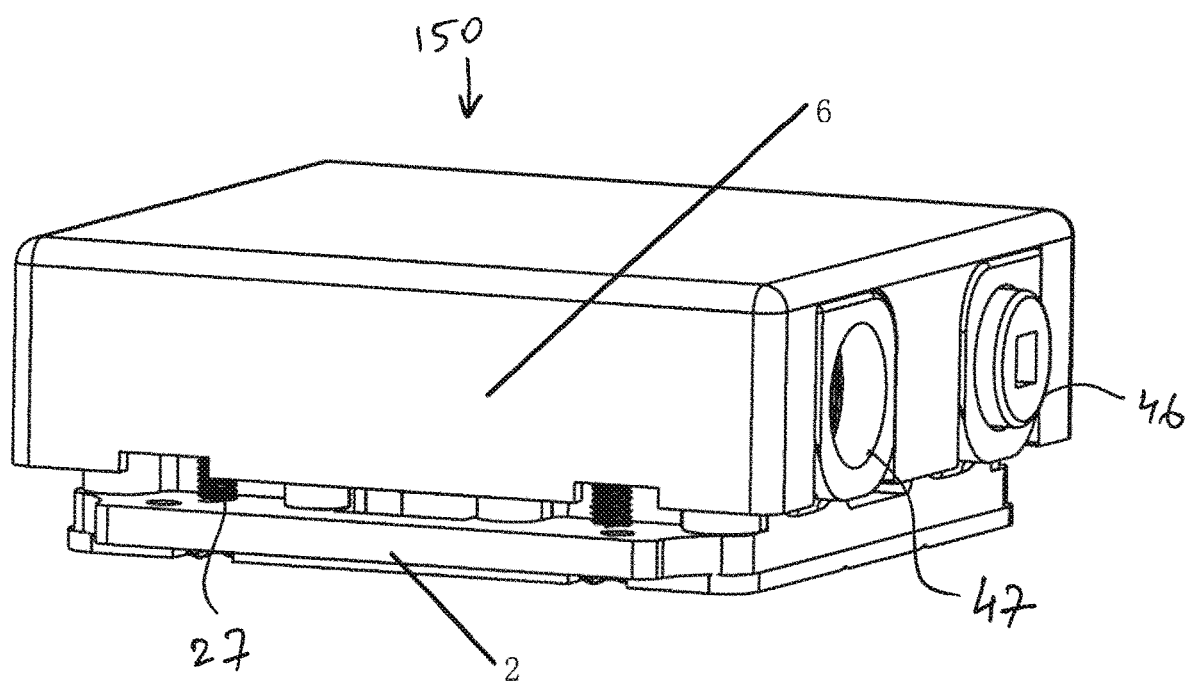
FIG. 15A illustrates a top perspective view of the cooling apparatus, according to embodiments disclosed.
Figure 15B:
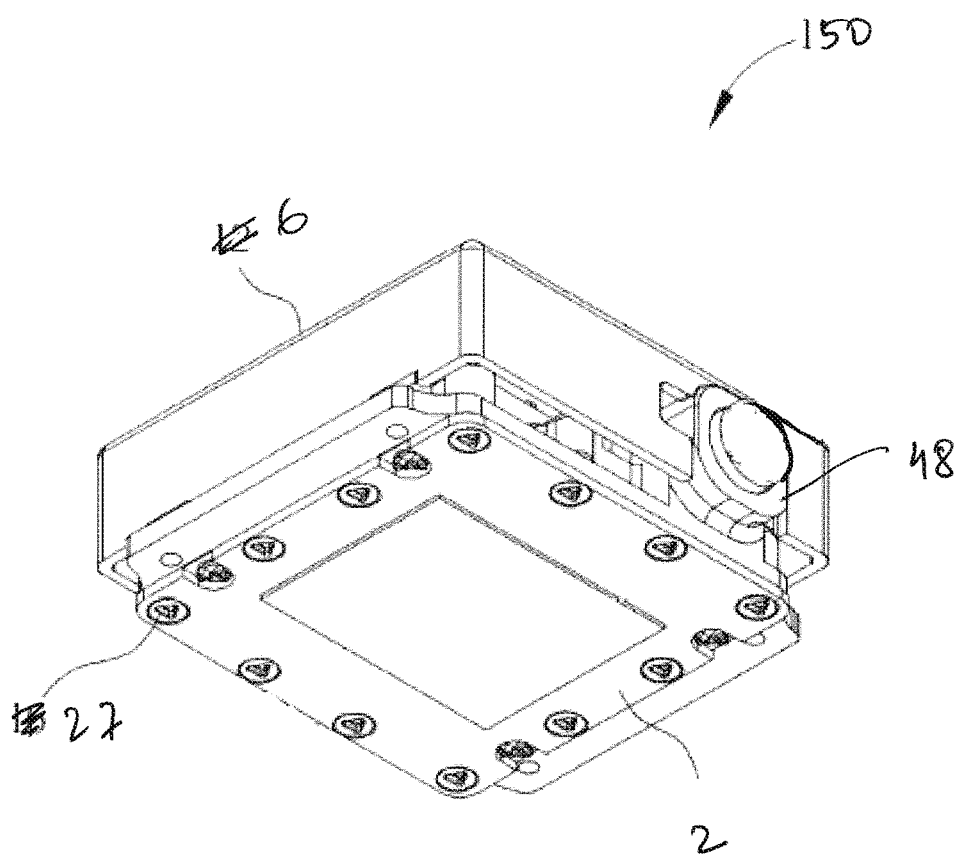
FIG. 15B illustrates a bottom perspective view of the cooling apparatus, according to embodiments disclosed.

FIG. 15A illustrates a top perspective view of the cooling apparatus 150 and FIG. 15B illustrates a bottom perspective view of the cooling apparatus 150, according to embodiments disclosed. As shown in FIGS. 15A and 15B, the cooling apparatus 150 includes an outer casing 6 installed on the base plate 2 and enclosing the housing 4, the flow guidance plate 3, and the cover member 1. The outlet 47 and the inlets 46, 48 of the housing 4 extend through the outer casing 6. The outer casing 6 is secured to the base plate 2 using fasteners, such as screws 27. However, any other kinds of fasteners may be used to secure the outer casing 6 to the base plate 2. The outer casing 6 protects the internal components of the cooling apparatus 150 and may be used for decorative purposes.

Figure 15C:
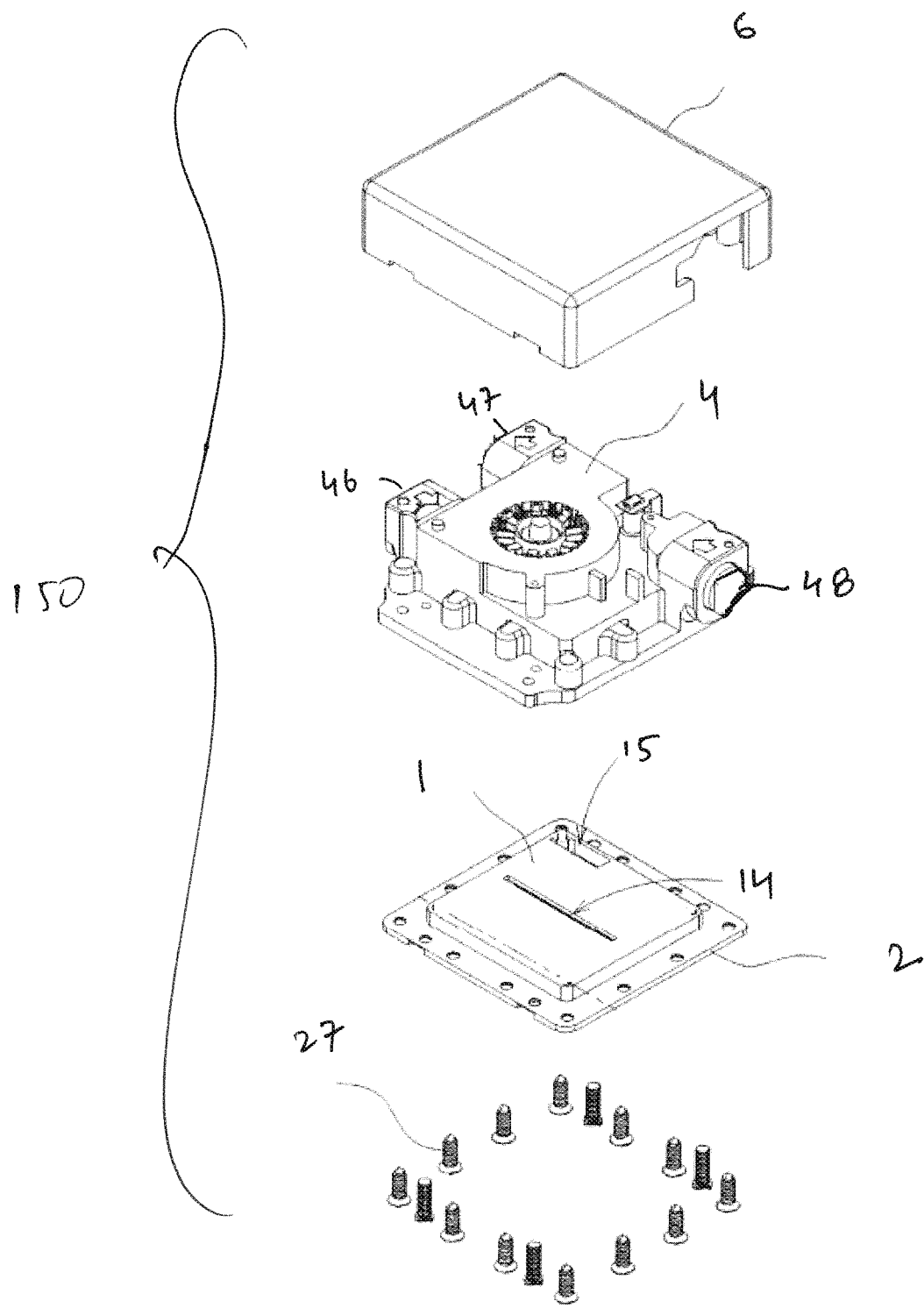
FIGS. 15C and 15D illustrate exploded view of the cooling apparatus including the cover member of FIG. 1, base plate of FIG. 3, flow guidance plate of FIG. 6, housing of FIG. 10, and the casing of FIG. 15A.
Figure 15D:
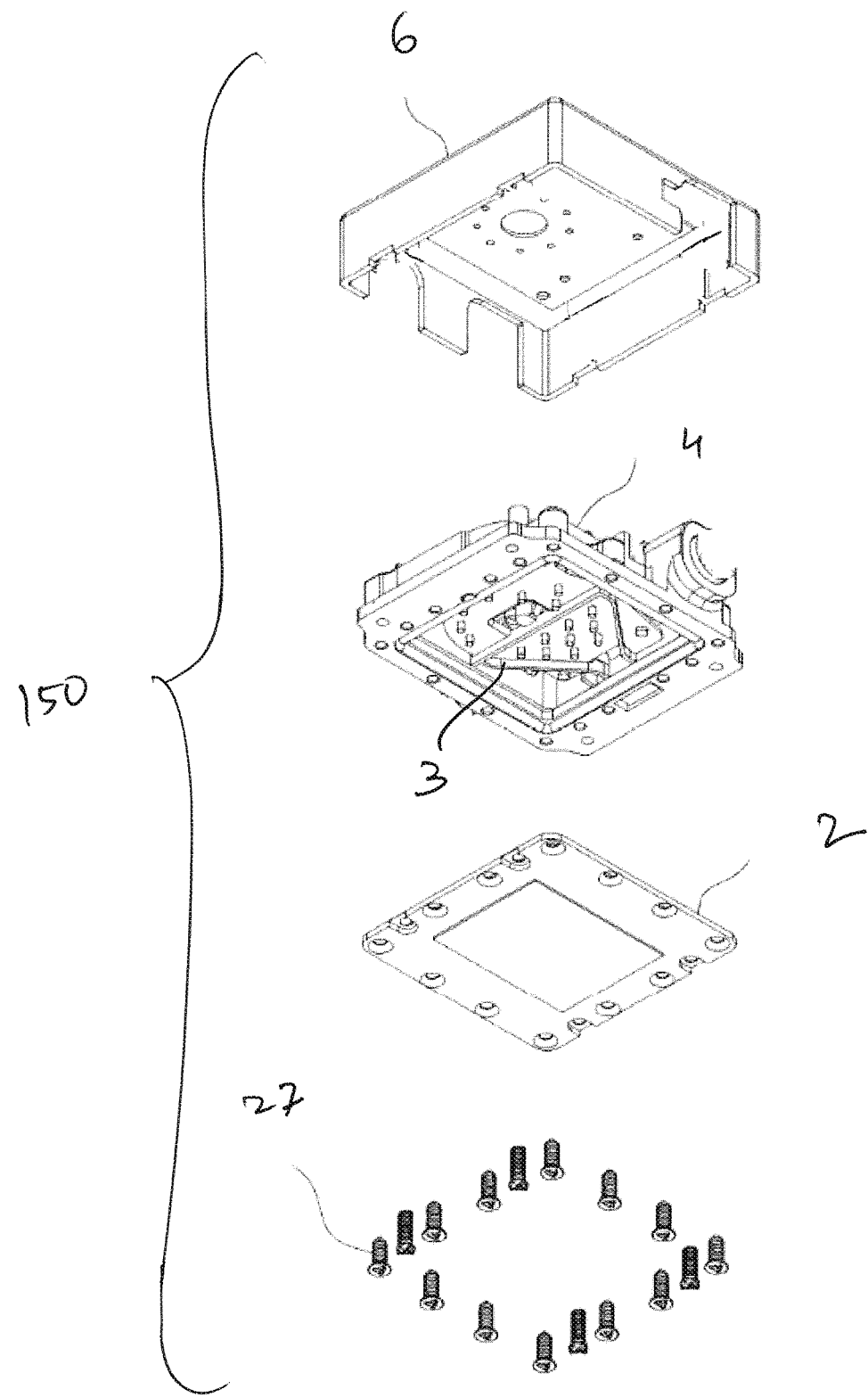

FIGS. 15C and 15D illustrate exploded view of the cooling apparatus 150 including the cover member 1, base plate 2, the flow guidance plate 3, the housing 4, and the outer casing 6.

Figure 16:
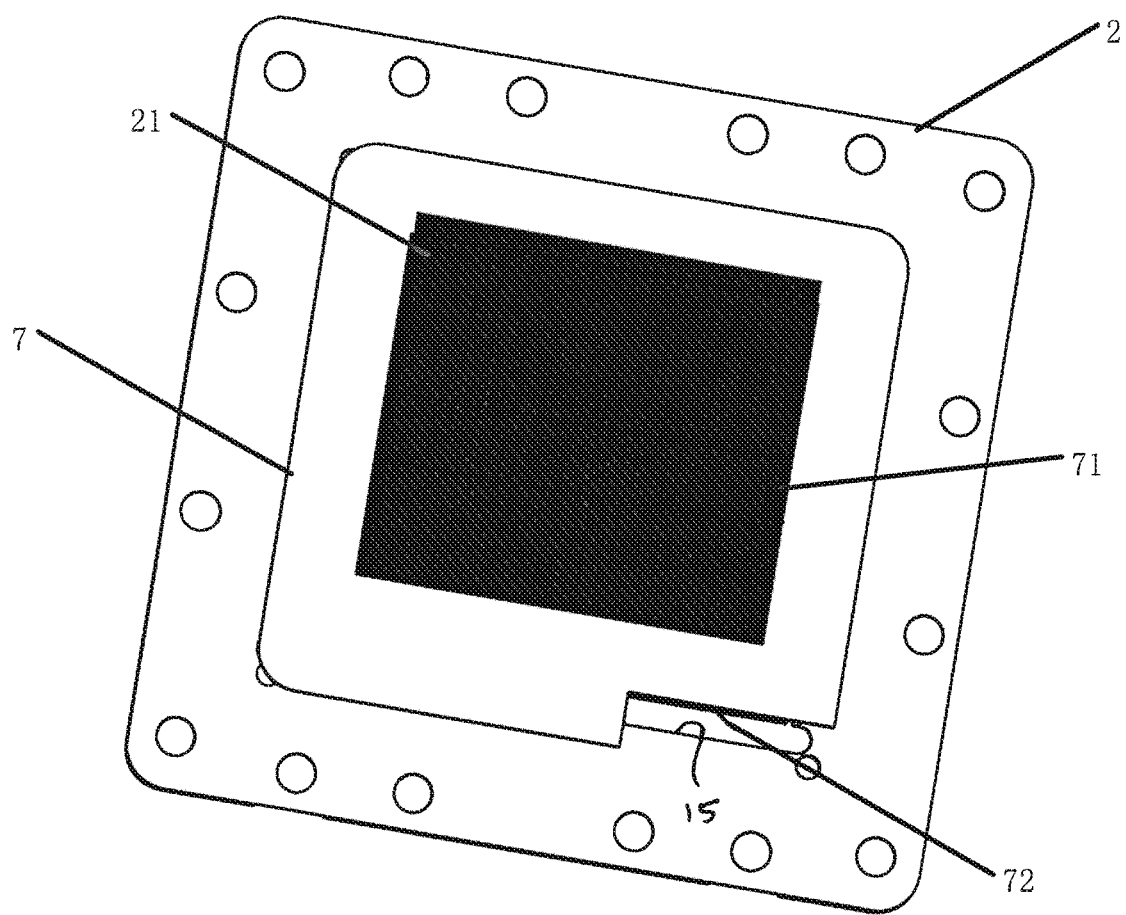
FIG. 16 illustrates a top view of a pad positioned on the base plate of FIG. 3, according to embodiments disclosed.

FIG. 16 illustrates a top view of a pad 7 positioned on the base plate 2, according to embodiments disclosed. As shown in FIG. 16, the pad 7 is attached to the base plate 2 in the space between the fins 21 and the cover member 1 (or more specifically, the sidewalls 12 of the cover member 1) when the cover member 1 is positioned on the fins 21. The pad 7 defines a through hole 71 located centrally in the pad 7 and a notch 72 on a side of the pad 7. The through hole 71 is sized to receive the plurality of fins 21, and the notch 72 prevents the pad 7 from obstructing the second opening 15 of the cover member 1. The pad 7 is used for filling the space between the cover member 1 and the fins 21 in order to prevent leakage of fluid.

Figure 17:
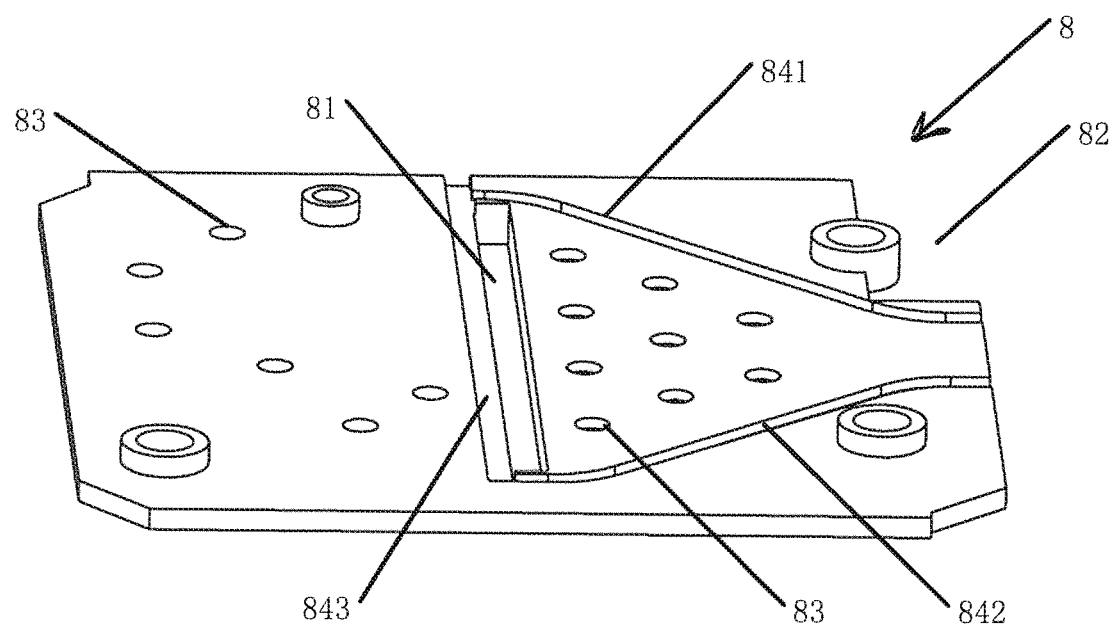
FIG. 17 illustrates a top perspective view of a partitioning plate, according to embodiments disclosed.

FIG. 17 illustrates a top perspective view of a partitioning plate 8, according to embodiments disclosed. As shown in FIG. 17, the partitioning plate 8 defines an opening 81 in a generally central portion of the partitioning plate 8, and a notch 82 at or adjacent an edge of the partitioning plate 8. When the partitioning plate 8 is positioned on the cover member 1, the opening 81 cooperates or aligns with the first opening 14 of the cover member 1 and the notch 82 prevents the partitioning plate 8 from obstructing the second opening 15 of the cover member 1. The partitioning plate 8 further defines two sidewall openings 841, 842 that receive the two sidewalls 351, 352 of the flow guidance plate 3, respectively. In an embodiment, the two sidewall openings 841, 842 may be slots. However, in other embodiments, the two sidewall openings 841, 842 can have any desired shape or size that can receive the two sidewalls 351, 352. The partitioning plate 8 also defines an end wall slot 843 that receives the end wall 353 of the flow guidance plate 3. The partitioning plate 8 defines a plurality of openings 83 corresponding to the plurality of columns 36 of the flow guidance plate 3 and sized to receive the plurality of columns 36 when the flow guidance plate 3 is installed on the partitioning plate 8. The partitioning plate 8 may include a thermally resistive material.

Figure 18:
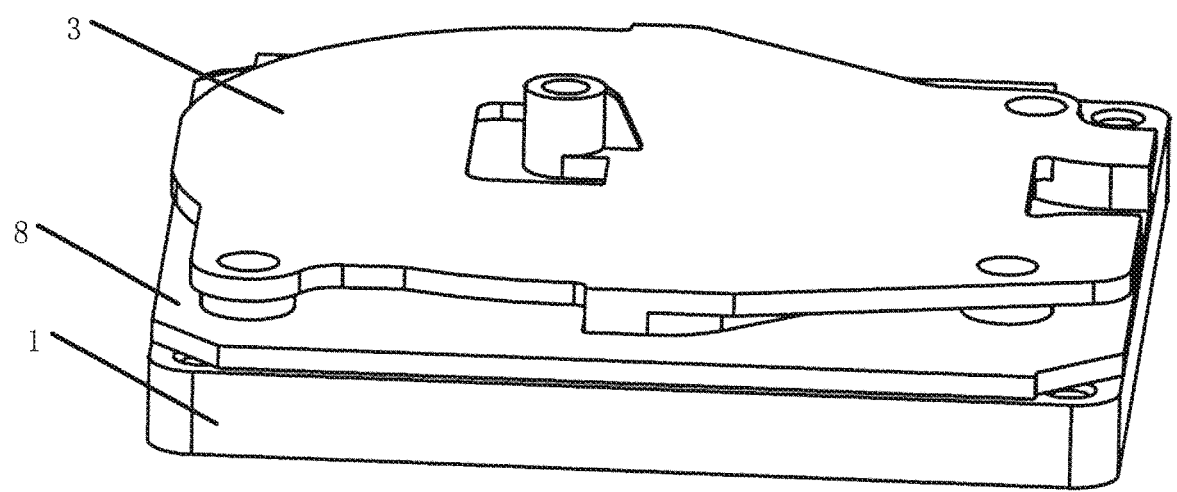
FIG. 18 illustrates a top perspective view of a structure including the flow guidance plate, the partitioning plate, and the cover member, according to embodiments disclosed.

FIG. 18 illustrates a top perspective view of a structure including the flow guidance plate 3, the partitioning plate 8, and the cover member 1, according to embodiments disclosed. As shown in FIG. 18, when installed, the partitioning plate 8 is between the flow guidance plate 3 and the cover member 1. When installed, the first cavity 371 and the second cavity 372 are bounded by the flow guidance plate 3 on the top and the partitioning plate 8 on the bottom thereof. The heat exchange chamber is connected to the first cavity 371 via the first opening 14 and the opening 81 in that order. The heat exchange chamber is connected to the fourth cavity 45 via the second opening 15 and the notch 82 in that order. The partitioning plate 8 is made of a non-thermally conductive material, such as plastic material, and, therefore, prevents an early (or premature) increase of the temperature of the heat exchange chamber before the cooler fluid is delivered from the pumping chamber into the heat exchange chamber.

Figure 19:
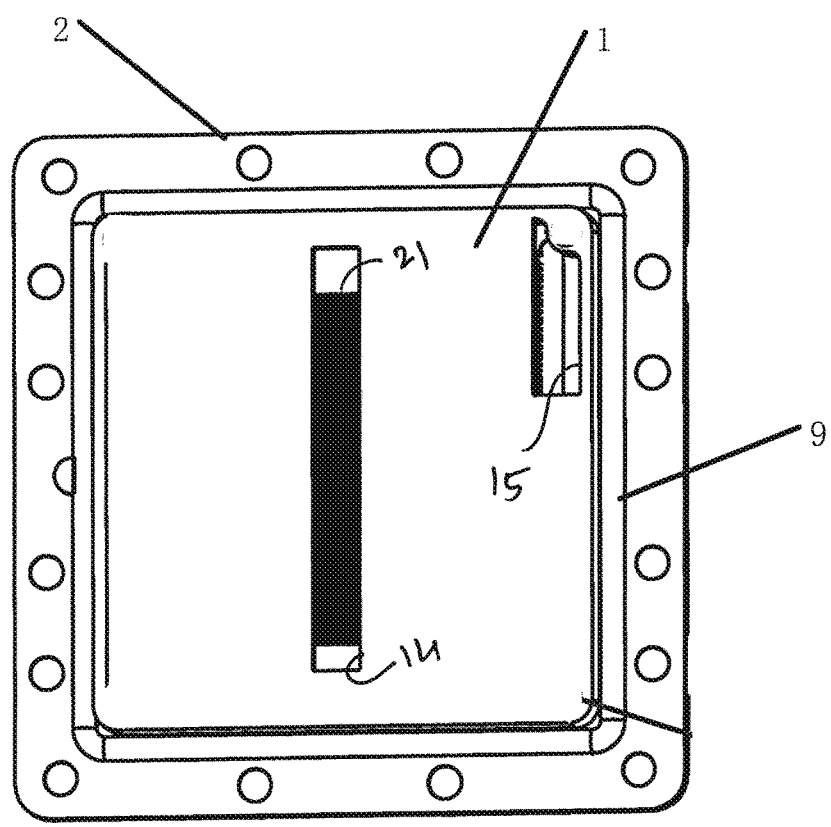
FIG. 19 illustrates a top plan view of the base plate including the cover member, according to embodiments disclosed.

FIG. 19 illustrates a top plan view of the base plate 2 including the cover member 1, according to embodiments disclosed. As shown in FIG. 19, a sealing element 9 (e.g., a gasket) is disposed at an interface of the cover member 1 and the base plate 2 to prevent leakage.

Figure 20A:
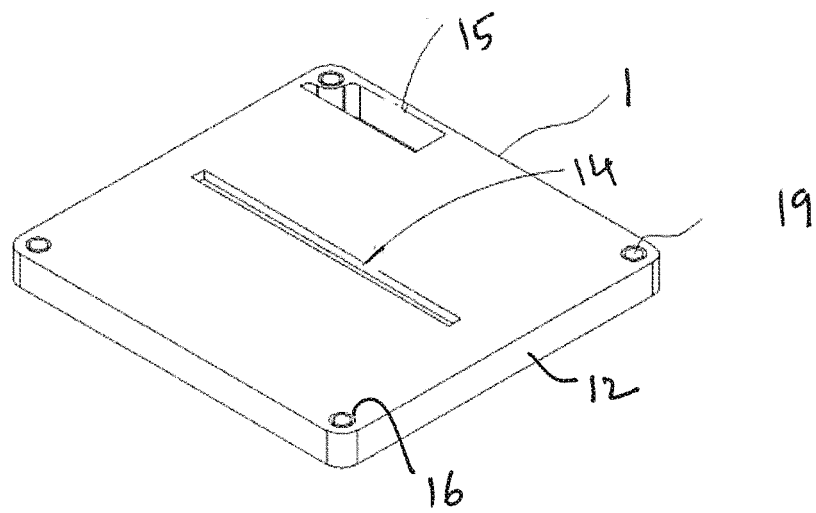
FIG. 20A illustrates top perspective views of the cover member and the base plate, according to embodiments disclosed.
Figure 20A:
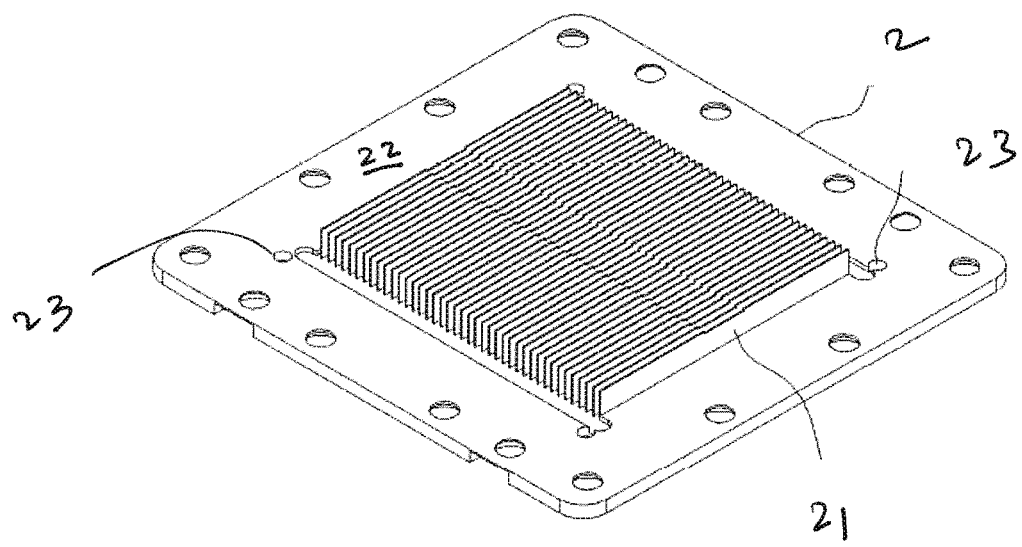
Figure 20B:
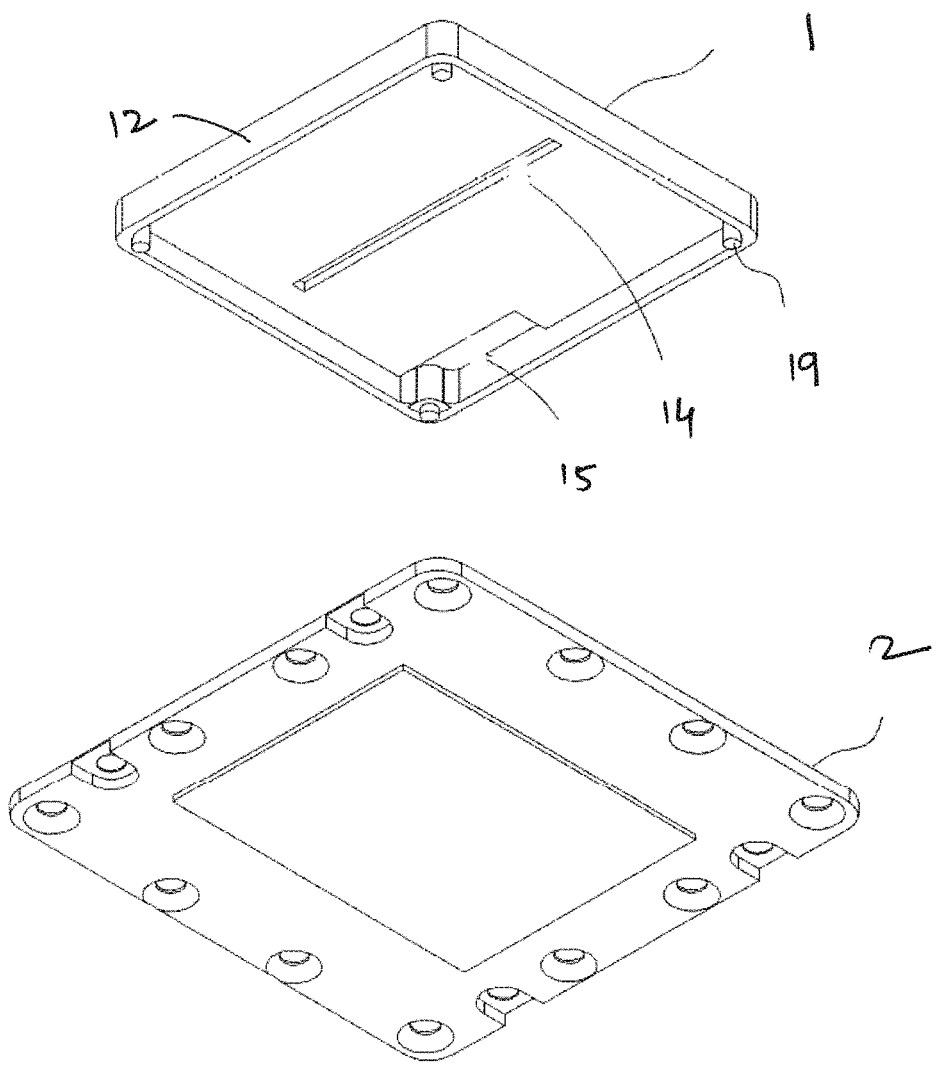
FIG. 20B illustrates bottom perspective views of the cover member and the base plate.

FIG. 20A illustrates top perspective views of the cover member 1 and the base plate 2, according to embodiments disclosed. FIG. 20B illustrates bottom perspective views of the cover member 1 and the base plate 2. As shown in FIGS. 20A and 20B, the peripheral surface 22 of the base plate 2 defines four first installation holes 23 formed at or adjacent the corners of the array of the fins 21. The sidewall 12 of the cover member 1 includes four second installation holes 16 corresponding to the first installation holes 23. When the cover member 1 is installed on the base plate 2, the cover member 1 encloses the fins 21 entirely and the first installation holes 23 and the second installation holes 16 coincide with each other.

The cover member 1 may be coupled to the base plate 2 using fixing members 19. In an example, the fixing members 19 may have a pillar or column like shape, and may be made of copper or other metallic material. In an embodiment and as illustrated, the fixing members 19 may be disposed in the second installation holes 16 defined in the cover member 1. In this case, the fixing members 19 may be secured in the second installation holes 16 using an injection molding process or the like. In another embodiment, the fixing members 19 and the cover member 1 may be formed integrally. During installation, the fixing members 19 may be aligned with the first installation holes 23 in the base plate 2 and then inserted into the first installation holes 23 using a punching process or other suitable techniques to ensure a tight fit.

Figure 20C:
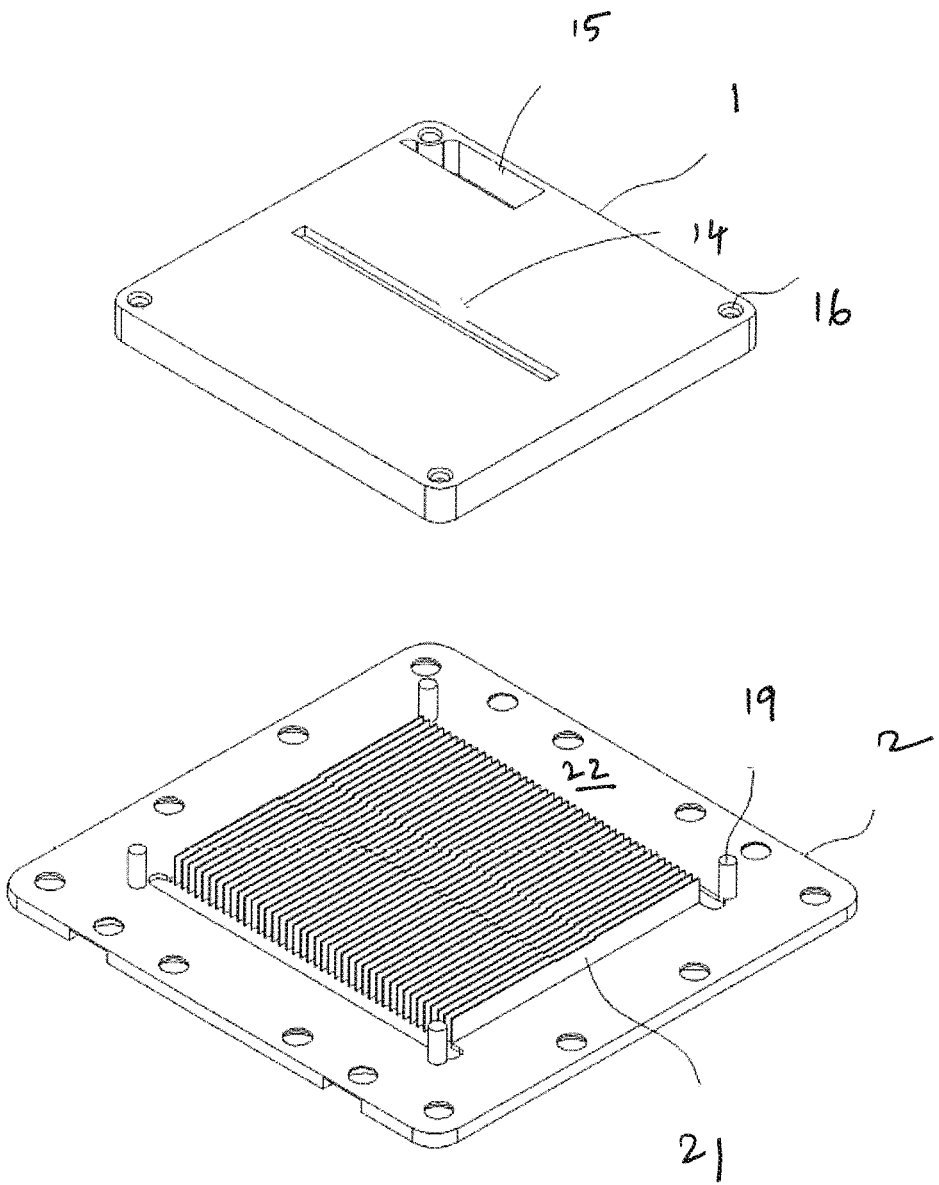
FIG. 20C illustrates a top perspective view of another embodiment of the cover member and the base plate.

FIG. 20C illustrates a top perspective view of another embodiment of the cover member 1 and the base plate 2. As illustrated, the fixing members 19 are disposed in the first installation holes 23 defined in the base plate 2. The fixing members 19 may be secured in the first installation holes 23 using a milling process or other suitable techniques. Alternatively, the fixing members 19 and the base plate 2 may be formed integrally. During installation, the fixing members 19 may be aligned with the second installation holes 16 in the cover member 1 and then inserted into the second installation holes 16 using a punching process or other suitable techniques to ensure a tight fit. In other examples, the fixing members 19 may be designed as engaging hooks and the second installation holes 16 may be in the form of engaging grooves defined in the cover member 1. The cover member 1 may be coupled to the base plate 2 by engaging the engaging hooks with the engaging grooves. However, other mechanisms and techniques may also be used to secure the cover member 1 to the base plate 2, without departing from the scope of the disclosure.

Figure 20D:
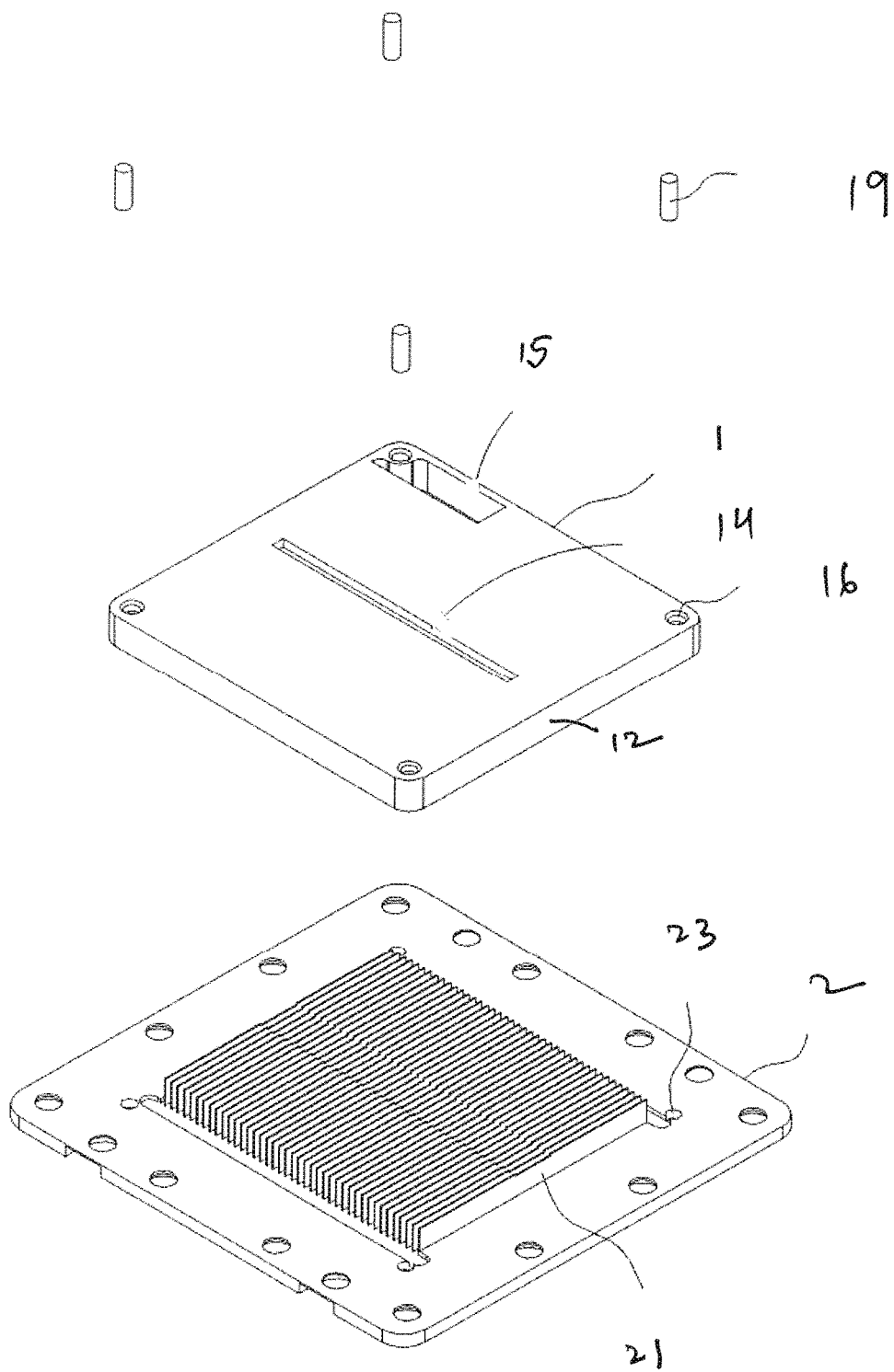
FIG. 20D illustrates a top perspective view of another embodiment of the cover member and the base plate.

FIG. 20D illustrates a top perspective view of another embodiment of the cover member 1 and the base plate 2. As illustrated, in this case, the fixing members 19 may be individual, discrete components. During installation, the first and second installation holes 23, 16 may be aligned with each other and the fixing members 19 may be inserted into the first and second installation holes 23, 16 using a punching process or other suitable techniques to ensure a tight fit.

Referring to FIGS. 20A-20D, the fixing members 19 prevent horizontal movement of the cover member 1 when it is installed on the base plate 2.

Figure 21:
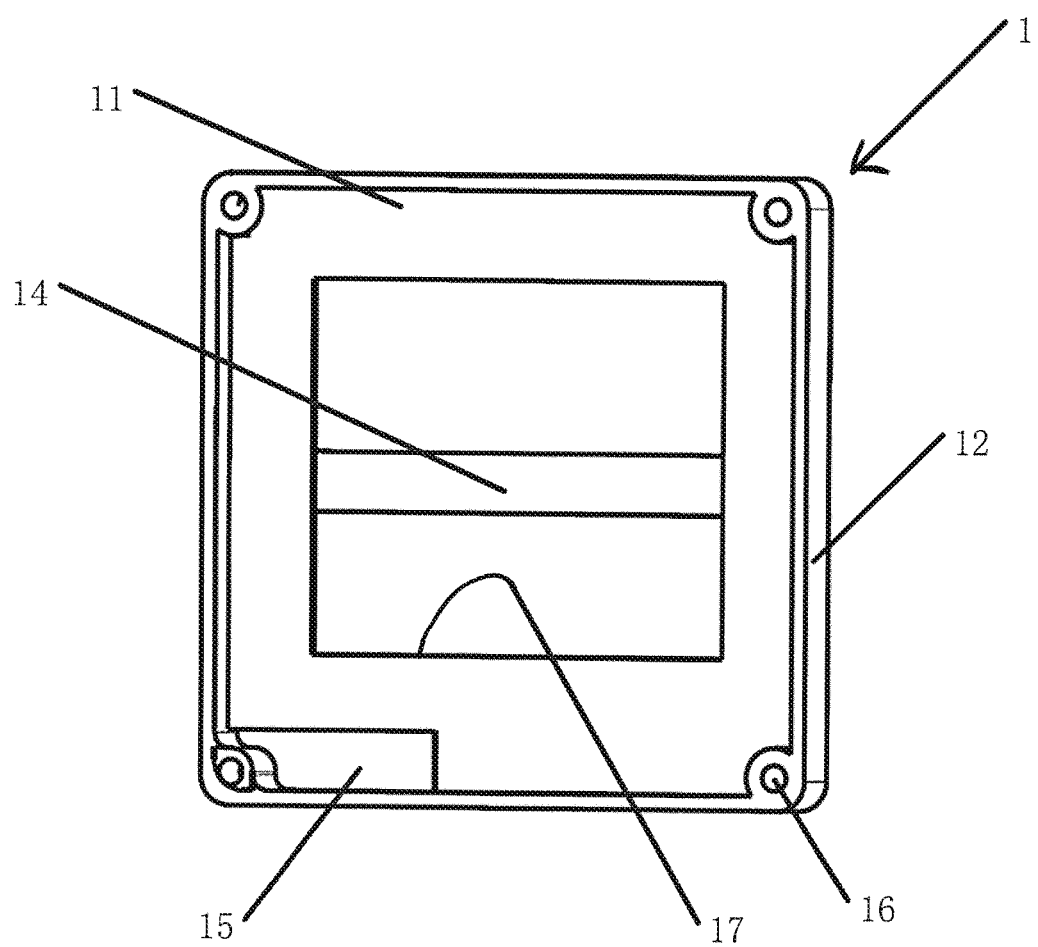
FIG. 21 illustrates a plan view of the top plate of FIG. 1 depicting an inner or bottom surface of the top plate used in any of the embodiments disclosed in FIGS. 20A-20D.

FIG. 21 illustrates a plan view of the cover member 1 depicting an inner or bottom surface of the top plate 11 of the cover member 1 that may be used in any of the embodiments disclosed in FIGS. 20A-20D above. The inner surface of the cover member 1 may define a concave portion (or a recess) 17 that cooperates with the plurality of fins 21, and receives a portion of the fins 21 when the cover member 1 is installed on the base plate 2. As a result, the horizontal movement of the cover member 1 is further minimized. Additionally, the internal volume of the heat exchange chamber is reduced and, thereby further limits the flow of the cooling fluid entering the heat exchange chamber. Thus, the cooling fluid is retained in the heat exchange chamber for a relatively longer time and the heat exchange efficiency is further increased.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A cooling apparatus, comprising:
    a base plate configured to dissipate heat and including a heat exchange unit;
    a cover member coupled to the base plate and at least partially enclosing the heat exchange unit, the cover member and the base plate defining a heat exchange chamber that includes the heat exchange unit, the cover member defining a first opening and a second opening, and the cover member being coupled to the base plate such that at least one of the first and second openings is above the heat exchange unit;
    a flow guidance plate disposed on a top surface of the cover member and including a bottom surface facing the top surface of the cover member, wherein
        the flow guidance plate at least partially defines a first cavity and a second cavity separated from the first cavity, and
        the first cavity and the second cavity are defined on the bottom surface of the flow guidance plate; and
    a housing disposed on the flow guidance plate.
2. The cooling apparatus of claim 1, wherein
    the heat exchange unit includes a plurality of fins, the first opening is a first elongated slot and the second opening is a second elongated slot parallel to the first elongated slot, the first and second elongated slots having different lengths, and the cover member is coupled to the base plate such that the first and second elongated slots extend perpendicular to the plurality of fins.

3. The cooling apparatus of claim 2, wherein the plurality of fins form an array having a width substantially equal to a length of the first elongated slot.

4. The cooling apparatus of claim 1, wherein the cover member and the base plate are coupled together by at least one weld.

5. The cooling apparatus of claim 1, wherein the flow guidance plate further defines a first plate opening in fluid communication with the second cavity and a second plate opening in fluid communication with the first cavity.

6. The cooling apparatus of claim 5, wherein the first cavity is in fluid communication with the heat exchange chamber via the first opening.

7. The cooling apparatus of claim 6, wherein the flow guidance plate and the housing define a pumping chamber that is in fluid communication with the first cavity via the second plate opening.

8. The cooling apparatus of claim 7, wherein the pumping chamber is in fluid communication with second cavity via the first plate opening.

9. The cooling apparatus of claim 8, wherein the pumping chamber is further defined by at least two extension portions, the at least two extension portions forming a channel that is in fluid communication with the first cavity via the second plate opening.

10. The cooling apparatus of claim 8, wherein the housing defines a first cavity and a second cavity fluidly isolated from each other, and wherein the housing includes at least one inlet that is in fluid communication with the first cavity, and an outlet that is in fluid communication with the second cavity.

11. The cooling apparatus of claim 10, wherein the housing further defines a third cavity which at least partially forms the pumping chamber and is sized to receive a rotor unit, and a fourth cavity sized to receive a stator unit.

12. The cooling apparatus of claim 10, wherein the second cavity is in fluid communication with the heat exchange chamber via the second opening.

13. The cooling apparatus of claim 10, wherein the first cavity of the housing is in fluid communication with the second cavity defined by the flow guidance plate.

14. The cooling apparatus of claim 1, further comprising an outer casing secured to the base plate and at least partially enclosing the cover member, the flow guidance plate, and the housing.

15. The cooling apparatus of claim 1, wherein the cover member is coupled to the base plate using a plurality of fixing members.

16. The cooling apparatus of claim 15, wherein the cover member defines a plurality of first installation holes and the base plate defines a plurality of second installation holes, and the cover member is coupled to the base plate such that the plurality of fixing members are positioned in the first and second installation holes.

17. The cooling apparatus of claim 16, wherein the cover member defines a concave portion sized to receive the heat exchange unit.

18. The cooling apparatus of claim 1, further comprising a partitioning plate between the cover member and the flow guidance plate, the partitioning plate including a thermally resistive material.

19. The cooling apparatus of claim 18, wherein the flow guidance plate includes a plurality of columns, and the partitioning plate defines a plurality of openings corresponding to the plurality of columns and sized to receive the plurality of columns when the flow guidance plate is installed in the partitioning plate.

20. The cooling apparatus of claim 1, further comprising a sealing element for sealing an interface between the cover member and the base plate.

\* \* \* \* \*